(12) United States Patent
Piquette et al.

(10) Patent No.: US 10,923,634 B2
(45) Date of Patent: Feb. 16, 2021

(54) WAVELENGTH CONVERTER HAVING A POLYSILOXANE MATERIAL, METHOD OF MAKING, AND SOLID STATE LIGHTING DEVICE CONTAINING SAME

(71) Applicant: OSRAM Opto Semiconductors GmbH, Regensburg (DE)

(72) Inventors: Alan Piquette, Kensington, NH (US); Gertrud Kräuter, Regensburg (DE); Matthias Loster, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 16/313,974

(22) PCT Filed: Jun. 30, 2017

(86) PCT No.: PCT/EP2017/066345
§ 371 (c)(1),
(2) Date: Dec. 28, 2018

(87) PCT Pub. No.: WO2018/002334
PCT Pub. Date: Jan. 4, 2018

(65) Prior Publication Data
US 2019/0172982 A1 Jun. 6, 2019

Related U.S. Application Data

(60) Provisional application No. 62/356,569, filed on Jun. 30, 2016.

(51) Int. Cl.
*H01L 33/50* (2010.01)
*C09K 11/02* (2006.01)

(52) U.S. Cl.
CPC ............ *H01L 33/502* (2013.01); *C09K 11/02* (2013.01); *H01L 33/501* (2013.01); *H01L 33/505* (2013.01); *H01L 2933/0041* (2013.01)

(58) Field of Classification Search
CPC .............................................. H01L 2933/0041
See application file for complete search history.

(56) References Cited

U.S. PATENT DOCUMENTS 8,937,329 B2 1/2015 Katayama
2007/0092636 A1 4/2007 Thompson et al.
(Continued)

FOREIGN PATENT DOCUMENTS

CN 1968993 A 5/2007
CN 103311404 A 9/2013
(Continued)

OTHER PUBLICATIONS

Notice of Reasons for Rejection dated Dec. 10, 2019, of counterpart Japanese Application No. 2018-567952, along with an English translation.
(Continued)

*Primary Examiner* — Thao P Le
(74) *Attorney, Agent, or Firm* — DLA Piper LLP US

(57) ABSTRACT

A method of making a wavelength converter includes (a) combining a luminescent material and inorganic nanoparticles with a liquid methoxy methyl polysiloxane precursor to form a liquid dispersion, the precursor having a methoxy content of 10 to 50 weight percent (wt %), the inorganic nanoparticles including at least 10 weight percent of the dispersion; (b) applying the liquid dispersion to a non-stick surface; (c) curing the liquid dispersion to form a filled polymer sheet; and (d) cutting the sheet to form individual wavelength converters having a desired shape.

27 Claims, 3 Drawing Sheets

(56) References Cited

U.S. PATENT DOCUMENTS

| | | | |
|---|---|---|---|
| 2010/0174024 A1* | 7/2010 | Du | C08K 3/36 524/428 |
| 2011/0098394 A1* | 4/2011 | Schmeltzer | C08G 18/792 524/413 |
| 2011/0186792 A1 | 8/2011 | Hirano | |
| 2013/0207148 A1 | 8/2013 | Kräuter et al. | |
| 2014/0001949 A1 | 1/2014 | Kimura et al. | |
| 2015/0152323 A1 | 6/2015 | Delaat et al. | |
| 2015/0291876 A1 | 10/2015 | Koole et al. | |

FOREIGN PATENT DOCUMENTS

| | | |
|---|---|---|
| EP | 2 060 537 A2 | 5/2009 |
| JP | 2011-137119 A | 7/2011 |
| JP | 2011-157461 A | 8/2011 |
| JP | 2014-168034 A | 9/2014 |
| WO | 2006/001874 A1 | 1/2006 |
| WO | 2013/109526 A2 | 7/2013 |
| WO | 2013/153007 A1 | 10/2013 |
| WO | 2017/182390 A1 | 10/2017 |

OTHER PUBLICATIONS

Japanese Reason of Rejection dated Aug. 4, 2020, of counterpart Japanese Application No. 2018-567952, along with an English translation.

The First Office Action dated Sep. 30, 2020, of counterpart Chinese Application No. 201780041232.3, along with an English translation.

\* cited by examiner

WAVELENGTH CONVERTER HAVING A POLYSILOXANE MATERIAL, METHOD OF MAKING, AND SOLID STATE LIGHTING DEVICE CONTAINING SAME

TECHNICAL FIELD

This disclosure relates to solid state lighting devices that contain silicone materials. More particularly, this disclosure relates to the use of silicone resins as matrix materials for luminescent materials in solid state lighting devices.

BACKGROUND

Silicones are used in solid state lighting devices such as light emitting diode (LED) packages, primarily as adhesives, phosphor encapsulants, and optics, e.g., lenses for light extraction. In a typical general lighting application, the operating temperature of the LED package may be as high as 90° C. to 110° C. For more demanding applications such as automotive headlamps, LED packages may experience temperatures on the order of 125° C. to 150° C., with some localized regions reaching upwards of 175° C. In the emerging high illuminance laser-activated remote phosphor (LARP) or high power LED projection applications, the temperatures may be even higher than those of the automotive applications.

Most methyl silicones retain their optical and mechanical properties for thousands of hours at temperatures below about 150° C. On the other hand, they can form cracks in a matter of days at temperatures above about 200° C. The currently available UL-listed optical silicones have relative temperature indices (RTIs) of 105° C. to 150° C. Phenyl silicones are even less stable, becoming brittle and developing a yellow color rapidly at temperatures above 150° C. As a result, standard methyl or phenyl silicones are unlikely to survive the extreme conditions present in high temperature and/or high flux applications such as LARP or newer high power LEDs. Therefore, a replacement material for the currently used silicones is necessary for many of the high temperature/flux applications.

SUMMARY

We thus provide:

A wavelength converter having a luminescent material dispersed in a highly cross-linked siloxane network formed from a low viscosity methoxy methyl siloxane precursor.

A method of making a wavelength converter having a polysiloxane matrix.

A solid-state lighting device such as a phosphor-converted LED (pc-LED) or laser diode containing the wavelength converter.

The polysiloxane matrix material is more stable than standard methyl silicones in high temperature and high flux applications and may include the following additional advantages:

1) A highly cross-linked polysiloxane-based wavelength converter can be made with cleaner/sharper edges than a screen printed silicone-based converter.
2) The wavelength converter can be made using an inexpensive process at room temperature (or slightly elevated temperature if it is desired to speed up the curing process).
3) Because the fabrication process does not require high temperature or solvents, the process is compatible with nearly all phosphors such that different colors from blue to red, including combinations (e.g., cool- and warm-white blends), are possible.
4) The technology is compatible with tape-casting and punching, which simplifies the manufacturing steps and reduces cost.
5) The highly cross-linked polysiloxane matrix material is much less tacky than standard silicones and converter elements can be punched without fouling the tooling.
6) The method of fabrication can produce wavelength converters that are more uniform in terms of brightness and color point than other methods.
7) Because the precursor material is a liquid, it is possible to incorporate different additives into the converter element such as nanoparticles, metal alkoxy precursors, organic molecules, polymers, and the like.
8) The methoxy methyl siloxane precursor lends itself to be used with or without solvent.

REFERENCES

Figure 1:
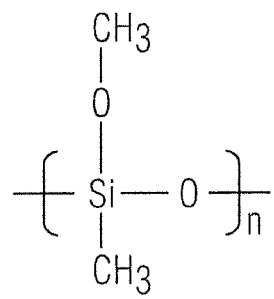
FIG. 1 is an exemplary structure of a methoxy functionalized methyl polysiloxane and/or methoxy functionalized methyl polysiloxane precursor, wherein the methoxy content is ~32 wt %. The number of repeat units, n, can vary.

11 ATR-FTIR for methoxy methyl siloxane in liquid resin
12 ATR-FTIR for methoxy methyl siloxane in cured form
500 solid state light device
502 LED die
504 wavelength converter
506 primary light
507 light emitting surface
516 secondary light
520 light emitting surface
526 adhesive
600 solid state lighting device
602 laser diode
606 primary light
610 substrate

DETAILED DESCRIPTION

For a better understanding of our materials, methods and devices, together with other and further advantages and capabilities thereof, reference is made to the following disclosure and appended claims taken in conjunction with the above-described drawings wherein like numerals designate like parts.

The term "wavelength converter" means an individual component to be used with a light source, preferably a semiconductor light source. The wavelength converter contains a luminescent material that converts a primary light emitted by the light source into a secondary light having a different wavelength than the primary light. The luminescent material may comprise a phosphor, quantum dots, or other photoluminescent material excited by the primary light emitted by the light source, preferably in the ultraviolet (UV) or visible region of the electromagnetic spectrum. The secondary light emitted by the luminescent material typically has a longer wavelength than the primary light (down-conversion.) Unconverted primary light passing through the converter combines with the emitted secondary light to provide the overall emission from the solid state light source, e.g., a blue-emitting LED may be combined with a wavelength converter having a yellow-emitting phosphor to produce an overall white light emission. In other applications, the primary light may be completely converted to secondary light (full conversion) so that a single color emission is generated from the solid state lighting device.

References to the color of a phosphor, LED or conversion material refer generally to its emission color unless otherwise specified. Thus, a blue LED emits a blue light, a yellow phosphor emits a yellow light and so on.

Preferably, the wavelength converter has a polysiloxane matrix preferably formed from a liquid methoxy methyl polysiloxane precursor at room temperature (or slightly elevated temperature if it is desired to speed up the curing process.) A preferred methoxy methyl polysiloxane precursor is shown in FIG. 1. The terminal groups of the polysiloxane precursor may comprise one or more chemically reactive groups such as alkoxy, vinyl, hydroxyl, carboxylic acid, ester, or other reactive functional group. In other examples, the terminal groups can be a less reactive group, for example, alkyls such as methyl and ethyl. While methyl and methoxy side groups are preferred, this does not exclude other functional groups such as ethyl, ethoxy, phenyl, phenoxy, vinyl, trifluoropropyl and the like. Moreover, other combinations of a polysiloxane backbone with methyl and methoxy side groups are possible.

In addition to phosphor particles, many other additives can be accommodated by the liquid precursor and, in turn, the final solid polysiloxane. These additives may include inorganic nanoparticles, metal alkoxy precursors, organic molecules, and other polymers. The different additives serve different purposes such as controlling the viscosity, providing crack resistance and enhanced mechanical strength, adjusting the refractive index, and increasing thermal conductivity.

Figure 2:
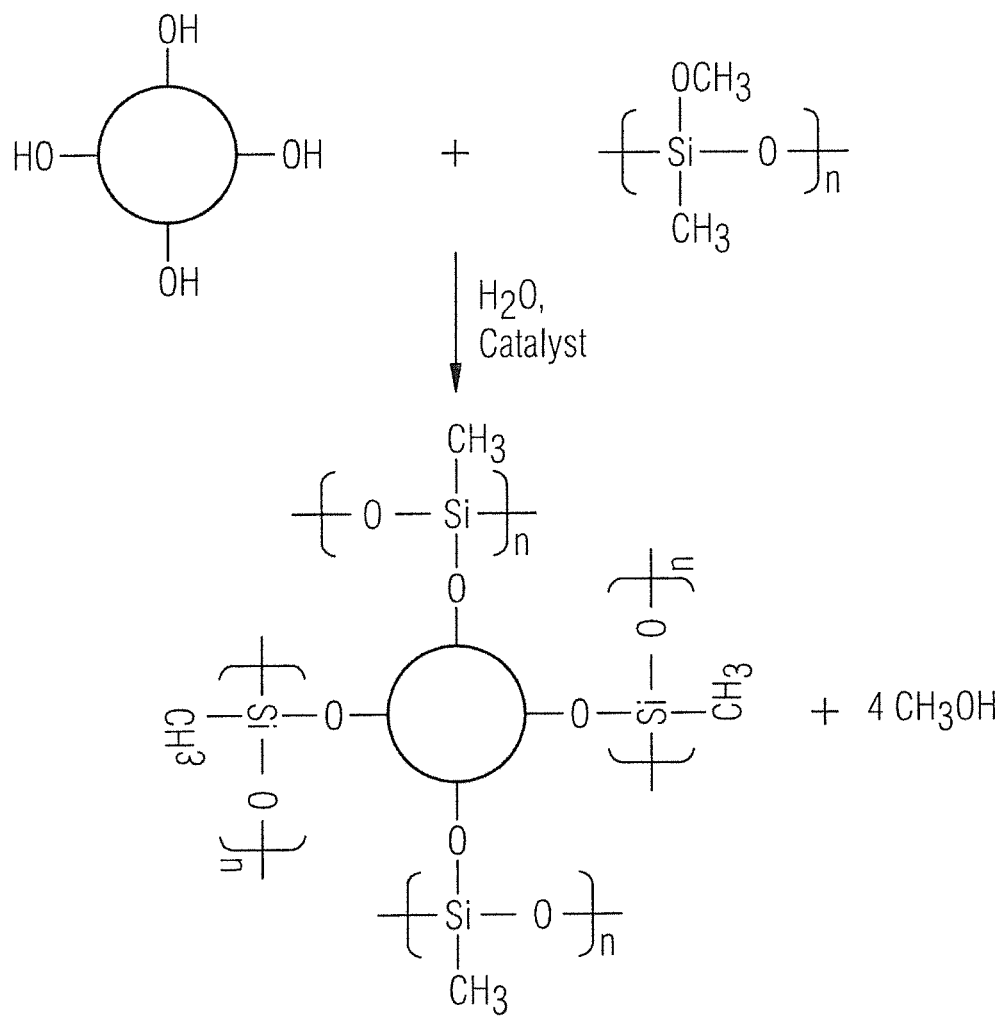
FIG. 2 is a schematic illustration of how a nanoparticle with hydroxy (—OH) groups can be incorporated into the polysiloxane network. This is for illustrative purposes only. It is not intended to imply that four polysiloxane units will bond to each nanoparticle, or that each hydroxyl group would be involved in the cross-linking.

An additional potential advantage of our polysiloxane materials over traditional silicones is how certain nanoparticles are incorporated. In traditional silicones, nanoparticles are usually present as simple physical mixtures. They are contained within the silicone network, but they are not chemically bonded. The precursor material has reactive alkoxy groups that may react with other alkoxy groups or hydroxy groups (among others). If the nanoparticles are made such that their surfaces contain alkoxy or hydroxy groups, they may chemically bond to the matrix material, making them part of the siloxane network, instead of just being physically trapped in the network. FIG. 2 is a simplified schematic of how this may work. The reactive methoxy groups on the polysiloxane can become hydrolyzed, leaving behind a silanol group and forming methanol as a byproduct. The hydroxy groups on the nanoparticle and the silanol groups of the polysiloxane can then undergo a condensation reaction, linking them together and forming water as the byproduct. This description is oversimplified since there will also be competing reactions, but the net result of main reactions is the same, namely a highly cross-linked network of nanoparticles and polysiloxanes.

This has implications for thermal conductivity, transparency, mechanical strength and the like. For example, a phonon will be able to propagate more easily along a continuous network of chemical bonds than through a physical mixture where there are thermal interfaces at every particle-silicone boundary. The transparency is also influenced by the type of composite. In simple physical mixtures, unless the particles are very small and are very well dispersed, there will be light scattering at every interface between materials of different refractive index, i.e., the particles and the matrix. On the other hand, if the nanoparticles are chemically bonded to the matrix material, it is more like a homogeneous system and scattering will be reduced or even eliminated.

A preferred polysiloxane precursor is a low molecular weight methoxy methyl polysiloxane where the methoxy content is 10 to 50 weight percent (wt %), more preferably 15 to 45 wt %, and even more preferably 30 to 40 wt %. During the curing process, each methoxy group that participates in the crosslinking reaction forms methanol (or similar volatile product), which easily evaporates from the system. Therefore, the more methoxy groups there are to begin with, the more organic content is removed during the curing. Preferably, the cured polysiloxane material loses less than about 20% of its initial weight when heating in air to 1000° C. The precursor is preferably a liquid at room temperature. The molecular weight (and number of siloxane units, n) should be such that the viscosity is 1-50 mPa·s, and preferably 2-20 mPa·s.

Figure 3:
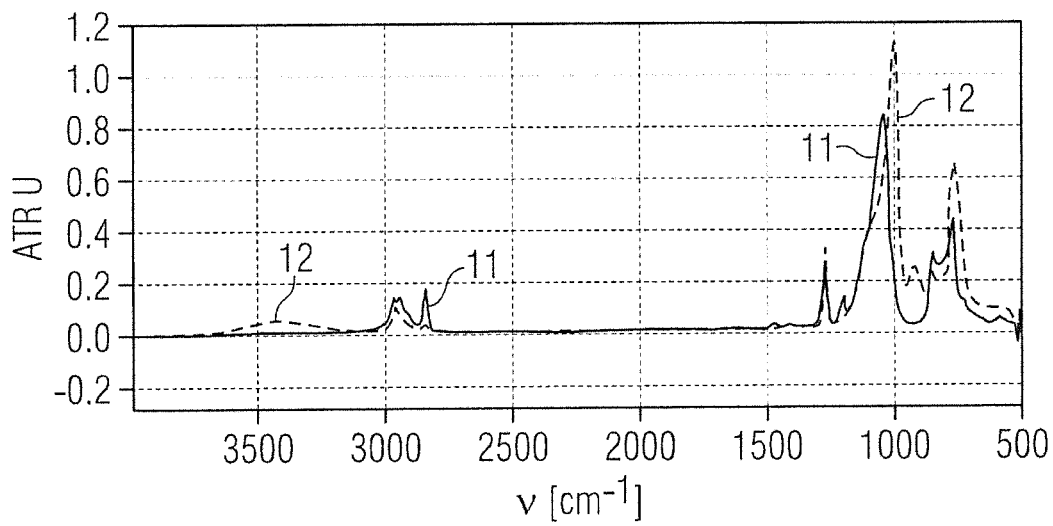
FIG. 3 shows Attenuated total reflectance-Fourier transform infrared spectroscopy (ATR-FTIR) spectra/curves in ATR Units (ATR U) for a preferred methoxy methyl siloxane in liquid resin (11) and cured (dashed, 12) forms ($v$—wavenumber in $cm^{-1}$).

The infrared spectra of a preferred methoxy methyl polysiloxane in liquid and cured forms are shown in FIG. 3 and contain absorption bands assigned as follows:

methyl (—$CH_3$) 2969-2944 $cm^{-1}$
methoxy (—O—$CH_3$) 2840 $cm^{-1}$
silicon methoxy (Si—O—$CH_3$) 1193, 851 $cm^{-1}$
siloxane (Si—O—Si) 1034-1000 $cm^{-1}$
silicon methyl (—Si—$CH_3$) 1269 $cm^{-1}$
silanol (—Si—OH) 919 $cm^{-1}$.

In the spectrum of the cured material, the peaks associated with the methoxy functionality (~2840 $cm^{-1}$ and 1192 $cm^{-1}$) have almost disappeared, indicating that most of the methoxy groups were involved in the crosslinking process or were replaced by silanol groups (the peak at 919 $cm^{-1}$ in the cured material is most likely due to the presence of silanol). The differences between the strongest peaks in the region of ~1000 $cm^{-1}$ to ~1150 $cm^{-1}$ suggest that there was a significant change in the siloxane structure going from liquid to cured forms. The broad peak at ~3400 $cm^{-1}$ indicates that the cured material absorbed some moisture.

There is a sharp peak at 1269 $cm^{-1}$ in both spectra. This peak is associated with Si—$CH_3$ motions. The location of this peak depends on the number of oxygen atoms to which the silicon is bonded. For siloxane compounds, a common naming scheme for describing the monomeric unit is shown in Table 1. This nomenclature system is based on the ratio of oxygen to methyl groups for a given silicon atom. The presence of the 1269 $cm^{-1}$ peak and the lack of any peaks at 1250 $cm^{-1}$ and 1260 $cm^{-1}$ suggests that only T-type units are present in either the resin or cured material indicating a structure similar to that shown in FIG. 4. This is confirmed by the peaks at ~762 cm$^{-1}$ and 767 cm$^{-1}$, which are also indicative of T units.

TABLE 1

Abbreviations for siloxane monomeric units and associated IR bands.

| Monomeric unit (R = methyl) | Abbreviation | IR bands for Si—R (cm$^{-1}$) |
|---|---|---|
| ~~O—Si(R)(R)—R | M | 1250<br>840<br>755 |
| ~~O—Si(R)(R)—O~~ | D | 1260<br>860 (weak)<br>800 |
| ~~O—Si(R)(O—)—O~~ | T | 1270<br>760-780 |

As described previously, phosphor powders may be added to the liquid precursor. The concentration of the phosphor (or phosphor blend) should be ≤80 wt % of the final phosphor-in-polysiloxane wavelength converter. For a given example, the concentration of a given phosphor in the cured polysiloxane matrix depends on the activator (e.g., Ce$^{3-}$ or Eu$^{2+}$) concentration, the phosphor's absorptance and quantum efficiency, the target color point, and if there are other scattering additives present in the system. The following is a nonexclusive list of phosphors that may be incorporated into the polysiloxane matrix:

$(RE_{1-x}Ce_x)_3(Al_{1-y}A'_y)_5O_{12}$ where RE is at least one of Y, Lu, Tb, and Gd, x is 0<x≤0.1, A' is at least one of Sc and Ga, and y is 0≤y≤1);

$(RE_{1-x}Ce_x)_3(Al_{5-2y}Mg_ySi_y)O_{12}$ where RE is at least one of Y, Lu, Tb, and Gd, x is 0<x≤0.1, and y is 0≤y≤2;

$(RE_{1-x}Ce_x)_3Al_{5-y}Si_yO_{12-y}N_y$ where RE is at least one of Y, Lu, Tb, and Gd, x is 0<x≤0.1, and y is 0≤y≤0.5;

$(RE_{1-x}Ce_x)_2CaMg_2Si_3O_{12}:Ce^{3+}$ where RE is at least one of Y, Lu, Tb, and Gd, and x is 0<x≤0.1;

$(AE_{1-x}Eu_x)_2Si_5N_8$ where AE is at least one of Ca, Sr, and Ba, and x is 0<x≤0.1;

$(AE_{1-x}Eu_x)AlSiN_3$ where AE is at least one of Ca, Sr, and Ba, and x is 0<x≤0.1;

$(AE_{1-x}Eu_x)_2Al_2Si_2N_6$ where AE is at least one of Ca and Sr, and x is 0<x≤0.1;

$(Sr_{1-x}Eu_x)LiAl_3N_4$ where x is 0<x≤0.1;

$(AE_{1-x}Eu_x)_3Ga_3N_5$ where AE is at least one of Ca, Sr, and Ba, and x is 0<x≤0.1;

$(AE_{1-x}Eu_x)Si_2O_2N_2$ where AE is at least one of Ca, Sr, and Ba, and x is 0<x≤0.1;

$(AE_xEu_y)Si_{12-2x-3y}Al_{2x-3y}O_yN_{16-y}$ where AE is at least one of Ca, Sr, and Ba, x is 0.2≤x≤2.2, and y is 0<y≤0.1;

$(AE_{1-x}Eu_x)_2SiO_4$ where AE is at least one of Ca, Sr, and Ba, and x is 0<x≤0.1; and $(AE_{1-x}Eu_x)_3SiO_5$ where AE is at least one of Ca, Sr, and Ba, and x is 0<x≤0.1.

Other phosphors may also be used including slight modifications of the examples listed above, e.g., incorporation of fluoride or other halide ions. For an automotive forward lighting application, the phosphor of choice will be a cerium activated, gadolinium doped garnet, $(Y_{1-x-y}Gd_xCe_y)_3Al_5O_{12}$, where x is from 0≤x≤0.2 and y is from 0<y≤0.05.

For many examples, additives play an important role in the processing ability of the precursor and/or the final properties of the highly cross-linked polysiloxane. One class of additives are inorganic nanoparticles (including crystalline and non-crystalline phases.) The following is a non-exclusive list of example materials:

Oxides: $SiO_2$, $ZrO_2$, $TiO_2$, $Al_2O_3$, and ZnO;
Nitrides: AlN, $Si_3N_4$, and BN; and
Carbon-based: carbon nanotubes and graphene.

In some examples, the surfaces of the inorganic nanoparticles may be modified with capping agents to make them miscible with the polysiloxane precursor. The concentration of nanoparticle additives may vary from 0 to 75 wt %. Preferably, the nanoparticles are comprised of $ZrO_2$ and/or $SiO_2$.

A second class of additives are liquid metal-containing compounds such as zirconium, titanium, and halfnium alkoxides. The concentration of this type of additive may vary from 0 to 75 wt %. A third class of additives are organic molecules that act as adhesion promoters, plasticizers, de-foamers, thickeners, thinners and the like. The concentration of this type of additive may vary from 0 to 10 wt %. A fourth class of additives are the organically modified silicas, silicates or ceramics. These additives may be added as-is to the siloxane precursor, but it may be more preferable to add the un-reacted precursors of these materials to the siloxane. A fifth class of additives are polymers, which may be organic (carbon-based chain) or inorganic (non-carbon-based chain). Some non-exclusive examples include poly(dimethyl siloxane), poly(methylphenyl siloxane), poly(diphenyl siloxane), poly(silphenylene-siloxane), polyphosphazenes, polysilazane, perhydropolysilazane. The concentration of this type of additive may vary from 0 to 75 wt %.

The typical combination of catalysts for the curing of the siloxane precursor to cross-linked polysiloxane is humidity and tetra-n-butyl titanate. The tetra-n-butyl titanate catalyst is not necessarily required since the presence of water (liquid or gas) is sufficient for the curing step in a number of applications. While these catalysts are preferred, other catalysts or combinations of catalysts may be used.

Figure 4:
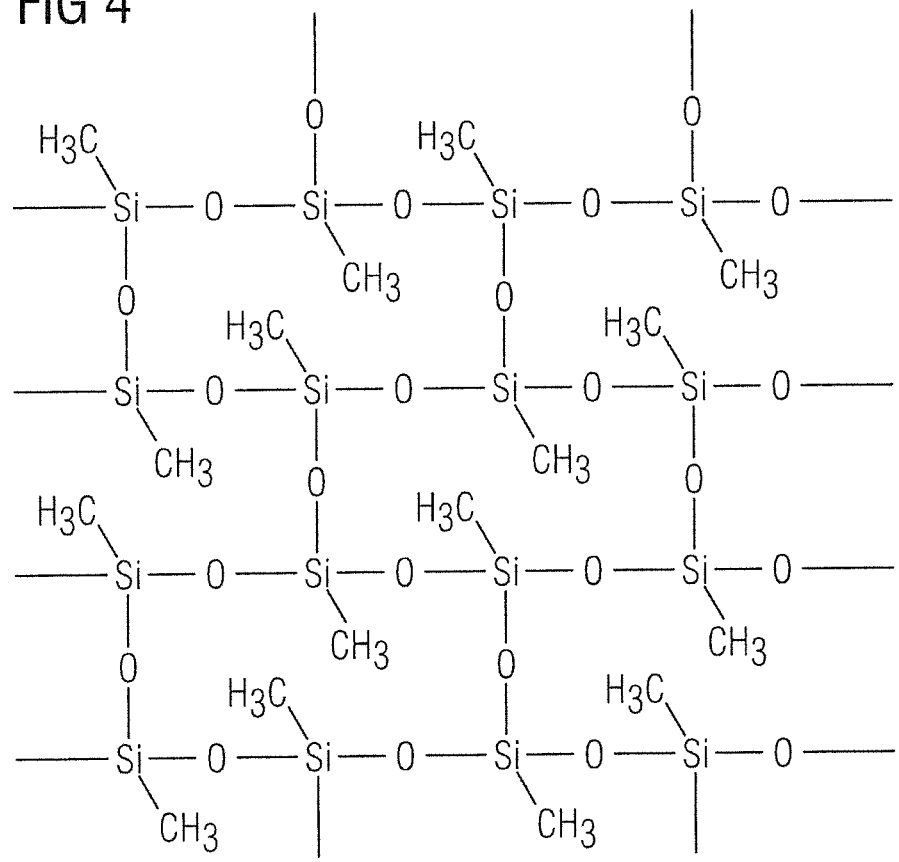
FIG. 4 is an exemplary structure of a highly cross-linked polysiloxane that can result from the hydrolysis and condensation of the precursor shown in FIG. 1. The dangling bonds can indicate a continuation of the structure or a terminal group.

When exposed to water, with or without a catalyst, the methoxy methyl polysiloxane precursor undergoes hydrolysis and condensation reactions, which cross-link the low molecular weight polysiloxane units into a dense polysiloxane network. FIG. 4 illustrates a polysiloxane network that will result if all the methoxy groups participated in cross-linking. In practice, not all of the methoxy groups likely result in cross-linking. Some of them may remain intact and some of them may be replaced by silanol groups. The structure drawn in FIG. 4 is for illustrative purposes and should not be construed as limiting the polysiloxane material in any way.

In one example, a phosphor-in-polysiloxane wavelength converter is made by first adding fumed silica to the liquid methoxy methyl polysiloxane precursor to increase the viscosity. Once the fumed silica is thoroughly incorporated, a desired phosphor powder or blend of phosphor powders is dispersed in the polysiloxane precursor. If desired, other additives, e.g., other oxide nanoparticles, may also be added to the liquid precursor. Typically, a catalyst such as a titanium alkoxide is added in an amount of 1 wt % to 5 wt %, but is not required. The relative amounts of phosphor and additives would depend on many criteria such as the size of the particles, the desired color point, the volume and thickness of the conversion layer, the wavelength of the exciting radiation, the type of solid state lighting device (e.g., laser or LED), and the amount(s) of other additive materials.

The precursor mixture will then be dispensed by any of a number of techniques such as spray-coating, dip-coating, spin-coating, drop-casting, tape-casting, doctor-blading or the like. It can be dispensed on a permanent substrate, temporary substrate, or on the LED itself. In the presence of humidity, or if liquid water is added to the precursor solution, the mixture will begin to cure at room temperature. If desired, curing can be accelerated by applying mild heating (~50° C. to ~150° C. or even higher). If necessary, the resulting phosphor-in-polysiloxane solid can then be punched or diced to the proper shape and size and incorporated into the LED package or laser-activated module.

Preferably, the polysiloxane precursor is combined with fumed silica, phosphor powder, and a catalyst. The dispersion is tape-cast or spray-coated onto a non-stick carrier foil. The tape is allowed to cure at room temperature in the presence of humidity for several hours to as long as three days and then removed from the non-stick foil. Wavelength converters are then formed to the desired size by dicing or punching the tape. The converters are heat treated at a temperature slightly above the expected operating temperature in the end-use application, preferably at least about 5° C. higher and more preferably 5° C. to 50° C. higher. The heat treatment step also can be performed before or after forming the individual converters. Preferably, the wavelengths converters are formed as small flat platelets having dimensions on the order of an LED die.

The target thickness of the final phosphor-in-polysiloxane part is preferably 25 µm to 200 µm. The concentration of the phosphor in the polysiloxane matrix depends on the activator concentration (e.g., $Ce^{3+}$ in $Y_3Al_5O_{12}$:Ce), the phosphor's absorptance and quantum efficiency, the target color point, and if there are other scattering additives present. A range of applicable phosphor concentrations is about 15-80 wt %. Preferably, wavelength converter contains about 50 wt % phosphor.

The individual converter platelets may be bonded to LEDs or other similar solid state lighting devices with an optical glue which could be a thin layer of polysiloxane that was made from the same precursor as the matrix material, only without the phosphor. The precise configuration of the solid state lighting device is not a limiting factor. For example, the peak of the exciting radiation could be in the near-UV, violet, indigo, and/or blue region of the electromagnetic spectrum, i.e., about 365 nm to 490 nm. A more preferred range is from 430 nm to 465 nm. For the LED examples, one or more LED dies can be directly bonded to a circuit board (chip-on-board configuration) or incorporated into a package. There can be some combination of these two configurations within a given module or light engine.

EXAMPLE

Fumed silica (12.5 wt %) and a $(Y_{1-x-y}Gd_xCe_y)_3Al_5O_{12}$ type phosphor (25 wt %) were added to a liquid methoxy methyl polysiloxane precursor (percentages correspond to total weight including the silica, phosphor, and liquid polysiloxane). After being thoroughly mixed, 1% to 5% tetra-n-butyl titanate was added to act as a catalyst. The precursor mixture was then tape-cast on, for example, a non-stick polymer sheet. The target thickness of the final, cured phosphor-in-polysiloxane converter was 10 µm to 500 µm, but preferably can be 25 µm to 200 µm. The tape-cast material was then allowed to cure at room temperature in ordinary ambient conditions. The curing time depends on the thickness of the tape and the relative humidity. Typically the material is dust dry after a few hours, but requires a longer curing time for full mechanical strength. Once cured, the phosphor-in-polysiloxane wavelength converters are punched out of the tape, using, for example, a numerical control (NC) punch tool. Preferably, the converters are heat treated to a temperature slightly above the anticipated application temperature. Depending on that temperature, the heat treatment step could be performed before or after punching. Once punched and heat treated, the individual converter platelets are ready to be incorporated into a lighting device based on a light emitting diode (LED) or laser diode (LD).

To test their stability, converter platelets (1 mm×1 mm with bond notch) made with a (Y,Gd)AG:Ce phosphor in the polysiloxane matrix were annealed for two hours at different temperatures up to 500° C. There was no browning or mechanical failure of the phosphor-in-polysiloxane converter even after annealing at 500° C. Conversely, a converter platelet made with a standard silicone matrix became unstable after annealing at 400° C. for two hours and crumbled at the slightest imparted force.

Figure 5:
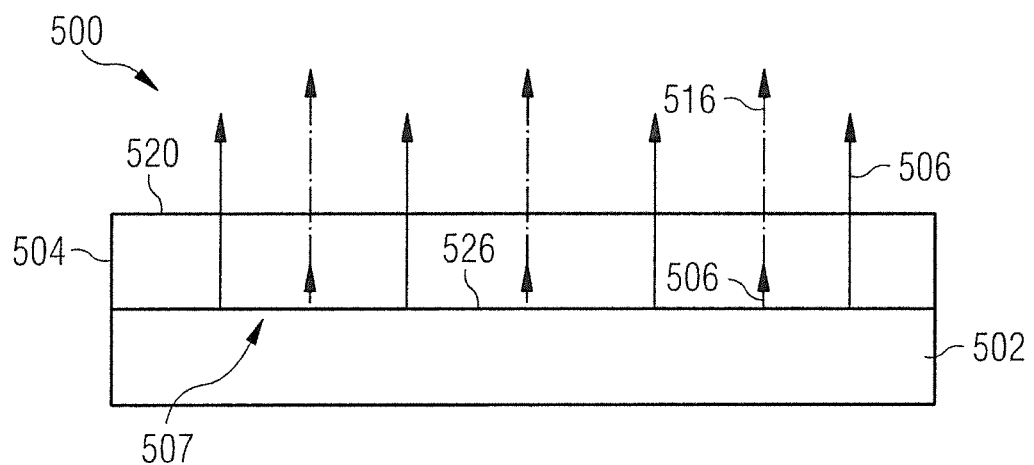
FIG. 5 is a schematic illustration of a solid state lighting device for an LED application.

LED Applications:

FIG. 5 illustrates an examples of a chip level conversion application in which solid state lighting device 500 has a separately formed wavelength converter 504 adhered to the light emitting surface 507 of LED die 502. The wavelength converter 504 is comprised of a phosphor-in-polysiloxane converter. The wavelength converter 504 is in the form of a flat platelet adhered to the light emitting surface 507 of LED die 502 using a thin layer of an adhesive 526. More particularly, the converter 504 may be attached to the LED die 502 with a thin (<10 µm) adhesive layer which may be any number of optical silicones. It may also be a low-melting glass or a water glass type of material, e.g., $A_2(SiO_2)_nO$ where A is some combination of Li, Na, or K and n is approximately 1 to 4, or monoaluminum phosphate, MALP. It can also be attached to the LED die with the disclosed highly cross-linked polysiloxane by depositing the liquid siloxane precursor on the LED and/or wavelength converter, bringing the two together so that the precursor is between the LED and wavelength converter, and letting the material cure. It can also be attached to the LED die with the disclosed highly cross-linked polysiloxane filled with nanoparticle additives such as $SiO_2$ and/or $ZrO_2$, by depositing the filled liquid siloxane precursor on the LED and/or wavelength converter, bringing the two together so that the precursor is between the LED and wavelength converter, and letting the material cure.

The thickness of the wavelength converter could vary from about 10 µm to about 500 µm, but is preferably 25 µm to 200 µm, or even more preferably 25 µm to 100 µm. In this example, the thickness of the wavelength converter 504 is chosen such that primary light 506 emitted by LED die 502 is only partially converted into secondary light 516. Secondary light 516 and unconverted primary light 506 exit the light emitting surface 520 of the solid state lighting device 500 to produce the desired overall emission from the solid state light device 500 which may be a white light.

Figure 6:
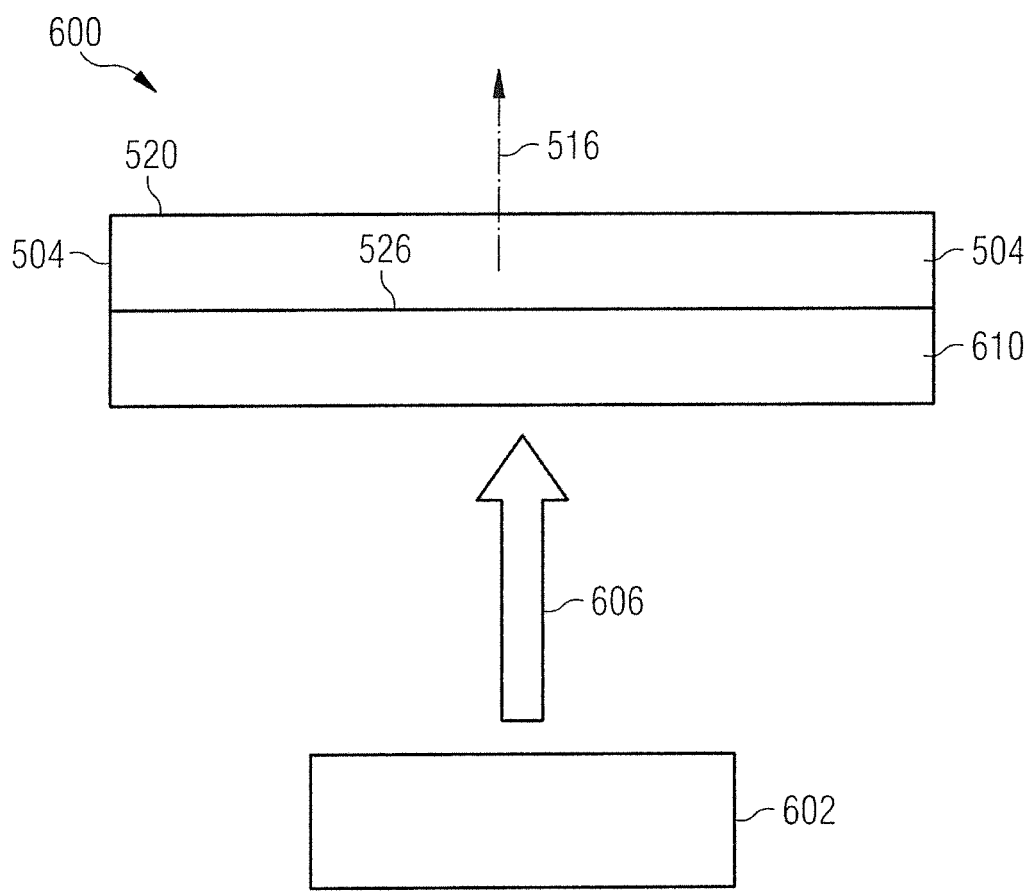
FIG. 6 is a schematic illustration of a solid state lighting device for a laser diode application.

Laser Diode Applications:

When the solid state light source of the solid state lighting device is a semiconductor laser diode, the phosphor-in-polysiloxane wavelength converter is preferably located remotely from the laser diode, typically separated by additional optical elements. As shown in FIG. 6, the solid state lighting device 600 has a wavelength converter 504 bonded to a transparent substrate 610, e.g., sapphire, that is at least transmissive to the primary light 606 emitted by laser diode 602. As previously described, an adhesive layer 526 may be used to bond the converter 504 to the substrate 610. The primary light 606 emitted by laser diode 602 impinges upon and is transmitted by substrate 610 whereupon it enters converter 504 to generate secondary light 516. In this transmissive example, it is often preferable to incorporate a dichroic layer on the incident side of the converter that allows the exciting radiation to pass, but reflects the down-converted radiation. Alternatively, the substrate 610 is reflective, e.g., a silver reflector, and the primary light 606 impinges directly on the light emitting surface 520 of the converter 504.

While we have shown and described what are at present considered to be preferred examples, it will be apparent to those skilled in the art that various changes and modifications can be made herein without departing from the scope of the appended claims.

This application claims priority of U.S. Application No. 62/356,569, the subject matter of which is incorporated herein by reference.

The invention claimed is:

1. A method of making a wavelength converter comprising:
    (a) combining a luminescent material and inorganic nanoparticles with a liquid methoxy methyl polysiloxane precursor to form a liquid dispersion, the precursor having a methoxy content of 10 to 50 weight percent (wt %), the inorganic nanoparticles comprising at least 10 weight percent of the dispersion;
    (b) applying the liquid dispersion to a non-stick surface;
    (c) curing the liquid dispersion to form a filled polymer sheet; and
    (d) cutting the sheet to form individual wavelength converters having a desired shape.

2. The method of claim 1, wherein the methoxy content is 15 to 45 wt %.

3. The method of claim 1, wherein the methoxy content is 30 to 40 wt %.

4. The method according to claim 1, wherein the inorganic nanoparticles comprise 10 to 75 wt % of the dispersion.

5. The method according to claim 1, wherein the inorganic nanoparticles comprise 10 to 25 wt % of the dispersion.

6. The method according to claim 1, wherein the inorganic nanoparticles are $ZrO_2$, $SiO_2$ or a combination thereof.

7. The method of claim 6, wherein the inorganic nanoparticles are $SiO_2$.

8. The method according to claim 1, wherein the liquid dispersion is applied to the non-stick surface by tape casting or doctor blading to form a tape.

9. The method of claim 8, wherein a thickness of the uncured tape is 25 μm to 500 μm.

10. The method according to claim 1, wherein cutting the sheet to form the individual converters comprises punching the sheet with a die having a desired shape of the converter.

11. The method according to claim 1, wherein the inorganic nanoparticles are hydrophobic.

12. The method according to claim 1, wherein the converters are annealed at a temperature at least 5° C. higher than an operating temperature of a desired application.

13. The method according to claim 1, wherein the methoxy methyl polysiloxane precursor has a viscosity of 1 to 50 mPa·s.

14. The method according to claim 1, wherein the methoxy methyl polysiloxane precursor has a viscosity of 2 to 20 mPa·s.

15. A wavelength converter comprising a luminescent material and inorganic nanoparticles dispersed in a polysiloxane matrix, the inorganic nanoparticles comprising at least 10 weight percent based on the combined weight of the polysiloxane matrix and the nanoparticles, wherein the organic content of the converter is less than 25 weight percent.

16. The wavelength converter according to claim 15, wherein the inorganic nanoparticles comprise 15 to 35 weight percent of the converter.

17. The wavelength converter according to claim 15, wherein the inorganic nanoparticles comprise 35 to 75 weight percent of the converter.

18. The wavelength converter according to claim 15, wherein the inorganic nanoparticles comprise $SiO_2$, $ZrO_2$, or a combination thereof.

19. The wavelength converter according to claim 15, wherein the inorganic nanoparticles comprise $Al_2O_3$, $TiO_2$, ZnO, BN or a combination thereof.

20. The wavelength converter according to claim 15, wherein the surface of the inorganic nanoparticles has functional groups chemically bonded to the polysiloxane matrix.

21. The wavelength converter according to claim 15, having a form of a flat platelet having a thickness of about 10 μm to about 500 μm.

22. The wavelength converter of claim 21, wherein the thickness is 25 μm to 200 μm.

23. The wavelength converter of claim 21, wherein the thickness is 25 μm to 100 μm.

24. The wavelength converter according to claim 15, that maintains mechanical integrity after heating at 400° C. for two hours.

25. The wavelength converter according to claim 15, wherein the luminescent material comprises 15 to 80 wt % of the converter.

26. A solid state lighting device comprising:
    a semiconductor light source and a wavelength converter, the wavelength converter having a luminescent material and inorganic nanoparticles dispersed in a polysiloxane matrix, the inorganic nanoparticles comprising at least 10 weight percent based on the combined weight of the polysiloxane matrix and the nanoparticles, wherein the organic content of the converter is less than 25 weight percent.

27. The solid state lighting device of claim 26, wherein the semiconductor light source is a light emitting diode or a laser diode.

* * * * *